United States Patent
Beer et al.

(10) Patent No.: US 7,830,026 B2
(45) Date of Patent: Nov. 9, 2010

(54) SEMICONDUCTOR DEVICE WITH A PLASTIC HOUSING COMPOSITION THAT INCLUDES FILLER PARTICLES AND THAT AT LEAST PARTIALLY EMBEDS A SEMICONDUCTOR CHIP

(75) Inventors: Gottfried Beer, Nittendorf (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 617 days.

(21) Appl. No.: 11/526,102

(22) Filed: Sep. 25, 2006

(65) Prior Publication Data

US 2007/0069353 A1 Mar. 29, 2007

(30) Foreign Application Priority Data

Sep. 23, 2005 (DE) .................. 10 2005 045 767

(51) Int. Cl.
*H01L 23/29* (2006.01)
*H01L 21/00* (2006.01)

(52) U.S. Cl. .................. 257/789; 257/795; 257/E23.01; 257/E23.116; 257/E23.135; 438/126; 438/127

(58) Field of Classification Search .............. 340/539.1, 340/539.31, 540, 542, 546, 548, 545.6, 568.1, 340/568.3, 571, 687

See application file for complete search history.

(56) References Cited

U.S. PATENT DOCUMENTS

| 4,265,755 | A | | 5/1981 | Zimmerman | |
|---|---|---|---|---|---|
| 4,705,762 | A | | 11/1987 | Ota et al. | |
| 5,011,872 | A | | 4/1991 | Latham et al. | |
| 5,450,283 | A | * | 9/1995 | Lin et al. | 361/704 |
| 5,681,883 | A | | 10/1997 | Hill et al. | |
| 6,278,192 | B1 | | 8/2001 | Takigawa et al. | |
| 6,284,959 | B1 | | 9/2001 | Nicolosi | |
| 6,372,351 | B1 | | 4/2002 | Takemiya et al. | |
| 6,379,997 | B1 | * | 4/2002 | Kawahara et al. | 438/106 |
| 7,218,266 | B2 | * | 5/2007 | Fujieda et al. | 342/1 |
| 2003/0092217 | A1 | * | 5/2003 | Coyle | 438/106 |
| 2003/0151030 | A1 | | 8/2003 | Gurin | |
| 2003/0155639 | A1 | | 8/2003 | Nakamura et al. | |
| 2003/0183418 | A1 | | 10/2003 | Castro et al. | |
| 2004/0100164 | A1 | * | 5/2004 | Murata et al. | 310/348 |
| 2004/0150091 | A1 | * | 8/2004 | Stobbs | 257/687 |
| 2004/0217472 | A1 | * | 11/2004 | Aisenbrey et al. | 257/734 |
| 2005/0016714 | A1 | | 1/2005 | Chung | |
| 2005/0222323 | A1 | | 10/2005 | Zhou et al. | |
| 2006/0003580 | A1 | * | 1/2006 | Goh et al. | 438/652 |
| 2006/0040112 | A1 | | 2/2006 | Dean et al. | |
| 2007/0114640 | A1 | * | 5/2007 | Kosowsky | 257/666 |
| 2008/0035370 | A1 | * | 2/2008 | Kosowsky et al. | 174/257 |
| 2008/0111236 | A1 | * | 5/2008 | Lee et al. | 257/738 |

* cited by examiner

*Primary Examiner*—Tai T Nguyen
(74) *Attorney, Agent, or Firm*—Edell, Shapiro & Finnan, LLC

(57) ABSTRACT

A semiconductor device with plastic housing composition includes an internal wiring that is electrically insulated from the plastic housing composition by an insulation layer. The plastic housing composition has a high thermal conductivity and a low coefficient of expansion, the coefficient of expansion being adapted to the semiconductor chip of the semiconductor device. This is achieved by forming the plastic housing composition with electrically semiconducting and/or electrically conducting filler particles. In particular, this plastic housing composition is advantageously used for semiconductor devices with flip-chip contacts and/or for semiconductor devices which are constructed according to the "universal packaging concept".

15 Claims, 3 Drawing Sheets

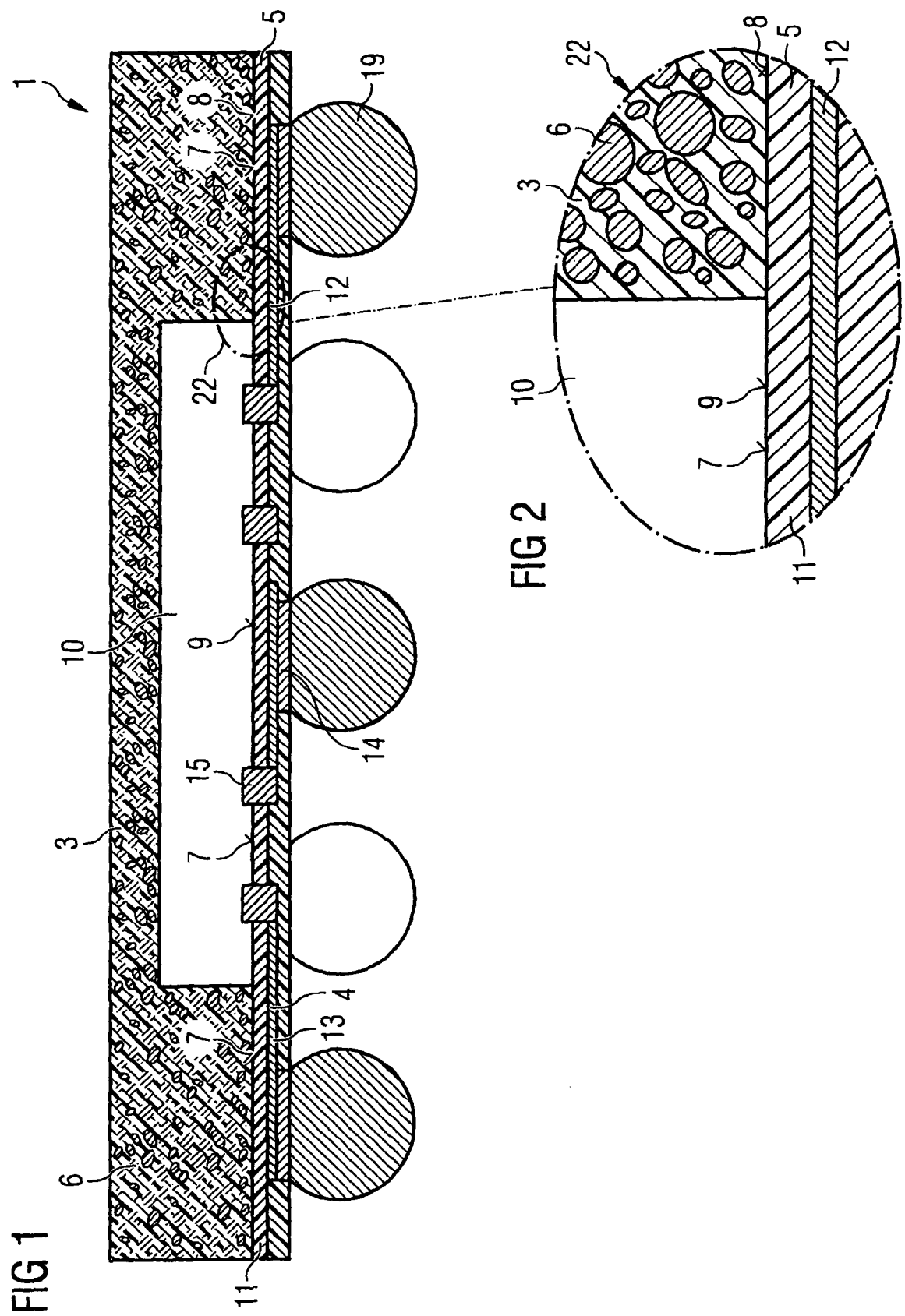

SEMICONDUCTOR DEVICE WITH A PLASTIC HOUSING COMPOSITION THAT INCLUDES FILLER PARTICLES AND THAT AT LEAST PARTIALLY EMBEDS A SEMICONDUCTOR CHIP

CROSS REFERENCE TO RELATED APPLICATIONS

This application claims priority under 35 U.S.C. §119 to Application No. DE 102005045767.3 filed on Sep. 23, 2005, entitled "Semiconductor Device with Plastic Housing Composition and Method for Producing the Same," the entire contents of which are hereby incorporated by reference.

FIELD OF THE INVENTION

The invention relates to a semiconductor device with plastic housing composition and a method for producing the same.

BACKGROUND

Semiconductor devices with plastic housing compositions are in widespread use in semiconductor electronics. On the one hand, the plastic housing composition is intended to protect and hold together the electronic components and, on the other hand, in so far as internal wirings are provided within the semiconductor device, they are intended to be electrically insulated from one another by the plastic housing composition. Filler particles are introduced into a plastic housing composition of this type and they are intended to reduce the coefficient of expansion of the plastic housing composition to an extent such that the thermal stresses between the plastic housing composition and semiconductor chips are reduced, and the filler particles are intended to increase thermal conductivity.

U.S. Pat. No. 5,011,872 discloses a plastic composition which has boron nitride as filler particles and, alternatively, also contains silicon carbide and aluminum nitride, in order to improve the thermal conductivity of the plastic housing composition and simultaneously to reduce the coefficient of thermal expansion of the plastic housing composition. U.S. Pat. No. 4,265,755 discloses a filler material which contains aluminum nitride, boron nitride or zinc oxide, having good thermal conductivity, and is intended to electrically insulate the components of the electronic semiconductor device from one another. U.S. Pat. No. 5,681,883 discloses a plastic composition for an injection molding method in which filler particles comprising boron nitride are admixed in order to reduce the thermal resistance and at the same time to reduce the coefficient of expansion of the plastic housing composition.

A common limitation to all of the previously described plastic compositions with fillers is that they have ceramic fillers which are limited in terms of their thermal conductivity and also cannot adequately decrease the coefficient of thermal expansion of the plastic housing composition even with a high degree of filler of 92% by volume.

SUMMARY

The present invention provides a semiconductor device with a plastic housing composition which utilizes novel filler particles that are better suited in terms of their thermal conductivity properties and also in terms of the properties that reduce the coefficient of thermal expansion of the plastic housing composition.

In accordance with the invention, a semiconductor device is provided with a plastic housing composition, the semiconductor device including an internal wiring that is electrically insulated from the plastic housing composition by an insulation layer. The plastic housing composition comprises electrically semiconducting and/or electrically conducting materials as filler particles.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 1 shows a schematic cross section through a semiconductor device in accordance with a first embodiment of the invention.

FIG. 2 shows a schematic enlargement of a partial region of the semiconductor device of FIG. 1.

DETAILED DESCRIPTION

Figure 3:
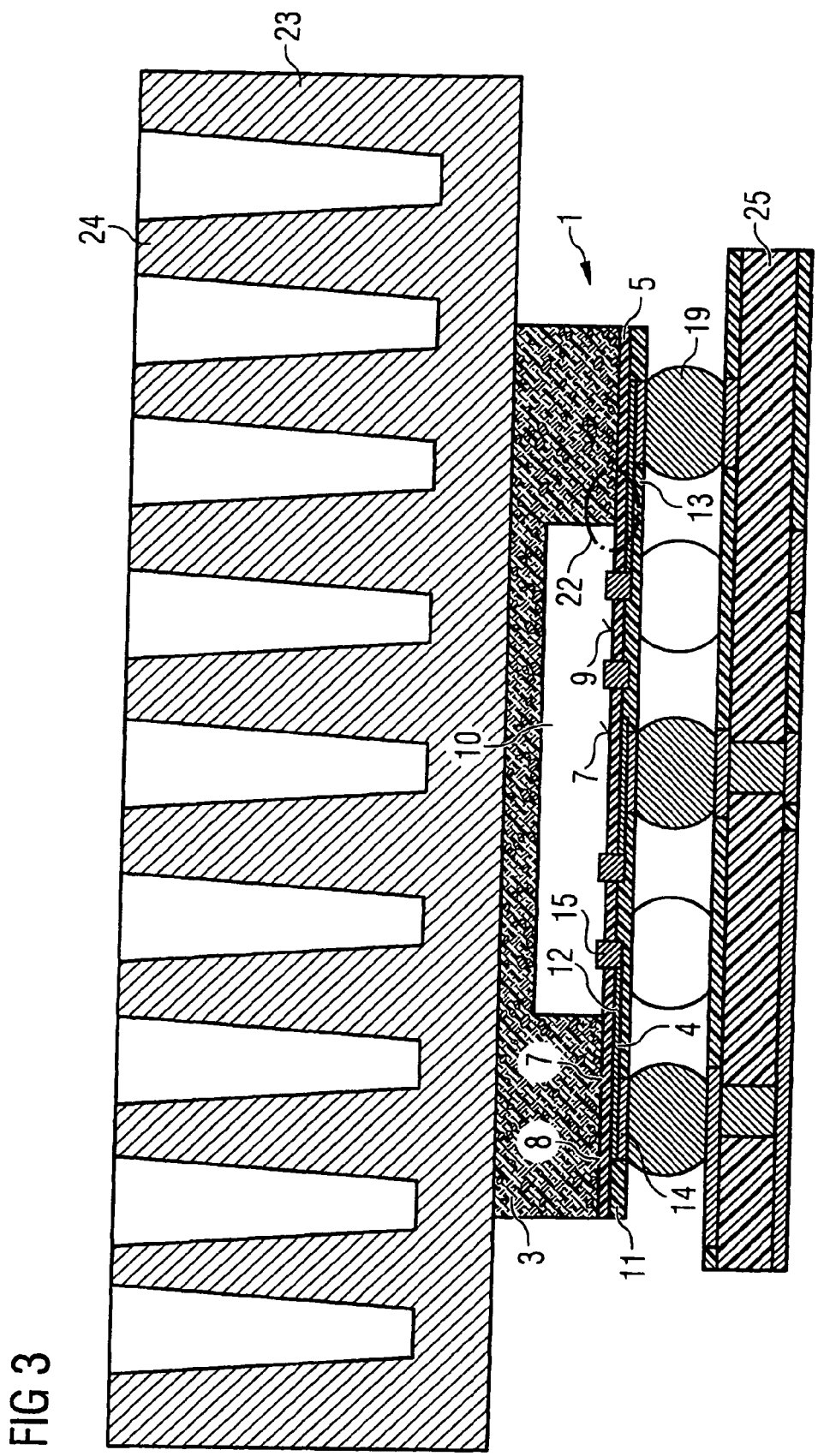
FIG. 3 shows a schematic cross section through the semiconductor device of FIG. 1 and further including a heat sink.

A semiconductor device is provided with a plastic housing composition in accordance with the invention, where the semiconductor device includes an internal wiring that is electrically insulated from the plastic housing composition by an insulation layer. The plastic housing composition comprises electrically semiconducting and/or electrically conducting materials as filler particles.

The semiconductor device of the invention provides a number of advantages including, without limitation, that the thermal stresses between semiconductor chips and plastic housing composition in a semiconductor device of this type can be reduced further since it is now possible to use filler materials which have not found application heretofore in semiconductor technology (since they are not completely electrically insulating). The internal wiring of the semiconductor device is not jeopardized by the plastic housing composition with electrically semiconducting and/or electrically conducting filler particles since the internal wiring is electrically insulated by a separate insulation layer.

This opens up the possibility of using a wide range of electrically semiconducting and electrically conducting filler particles which not only reduce the coefficient of thermal expansion and thus improve the thermal stresses between semiconductor chip and plastic housing composition, but primarily also significantly increase the thermal conductivity of a plastic housing composition of this type, so that accumulation of heat in conjunction with a high power loss of the semiconductor device does not occur within the plastic housing. Furthermore, a plastic housing composition of this type opens up the possibility of arranging a further heat sink directly onto the plastic housing composition, the heat sink taking up the heat loss via the plastic housing composition with electrically semiconducting and/or electrically conducting filler particles and dissipating it to the surroundings.

A third advantage that favors the plastic housing composition with electrically semiconducting and/or electrically conducting filler particles since the filler particles already constitute a shielding effect against electromagnetic interference radiation. This shielding is extremely intensive, moreover, since the plastic housing composition acts with its shielding particles directly on the upper sides of the embedded semiconductor chip.

In one preferred embodiment of the invention, the plastic housing composition comprises silicon particles. Silicon particles inherently behave like the silicon semiconductor chips themselves in terms of their expansion behavior, with the result that an ideal adaptation of the coefficient of thermal expansion may occur here. Moreover, polycrystalline silicon with high doping has a high thermal conductivity, with the result that these particles are particularly suitable for being used as filler particles in the plastic housing composition.

In a further preferred embodiment of the invention, the plastic housing composition is filled with carbon fiber particles. Carbon fiber particles may constitute a certain problem in the injection molding technique. However, thought is given to carbon fiber particles having extremely short sections, so that they assume more or less rod-shaped external contours. Carbon fiber particles of this type, mixed with plastic housing composition, can be processed relatively well, especially as carbon is also a lubricant, as long as the fibers comprise the graphite modification of carbon.

In a further embodiment of the invention, the plastic housing composition comprises carbon nanotube particles. Carbon nanotube particles of this type not only exhibit outstanding thermal conductivity properties, but are also suitable for being able to be introduced particularly densely in a plastic housing composition. Due to the high degree of filler that can be achieved with carbon nanotube particles and the extremely good thermal conduction properties of such carbon nanotubes, a plastic housing of this type affords a significant improvement of conventional plastic housing compositions with ceramic particles.

In accordance with another embodiment of the invention, a semiconductor device is provided comprising carbon fullerenes as filler particles in the plastic housing composition. The carbon fullerenes can be produced by pulverizing carbon electrodes in electrical discharge flashes. Fullerenes of this type have the advantage that they constitute a spherical network of hexagonally arranged carbon atom rings, the hexagonal ring structures then forming a closed spherical surface in a manner similar to a benzene ring. Such spherical particles have the further advantage that they are particularly well suited to an injection molding process. Compared with fibers and tubes, spherical particles of this type can be introduced into the plastic housing composition with a high degree of filler.

In a further embodiment of the invention, the plastic housing composition comprises metal particles. However, not all metal particles having excellent thermal conductivities are suitable for being incorporated into a plastic housing composition, since their coefficient of thermal expansion does not significantly reduce the coefficient of expansion of the plastic housing composition. Only metals having a very high melting point exhibit a minimal coefficient of thermal expansion and thus help to adapt the coefficient of expansion of the plastic housing composition to the coefficient of expansion of the semiconductor chip. Therefore, preferably molybdenum or tungsten particles are mixed into the plastic housing composition as fillers.

Filler particles made of a semiconductor material such as silicon are excellently suitable for use as filler, moreover, if they have an oxide layer on their upper side as a result of a simple thermal oxidation. It is thus possible to dispense with special insulation of the internal wiring in a semiconductor device. A different configuration is afforded by diamond-coated silicon particles. In particular, carbon is applied to the silicon and converted either into silicon carbide or into diamond particles. The formation of diamond coatings is accommodated by the crystal lattice structure of silicon, which corresponds exactly to the diamond lattice structure.

The plastic housing composition according to the invention with a filler made of electrically semiconducting and/or electrically conducting particles is particularly suitable for semiconductor devices having a coplanar area on which the internal wiring is arranged, and/or for semiconductor devices with flip-chip contacts, the flip-chip contacts and the associated internal wiring being embedded in an insulating underfill material. Consequently, the invention improves semiconductor devices having a coplanar area comprising an upper side of the plastic housing composition and the upper side of at least one semiconductor chip.

An insulating intermediate layer that carries a wiring structure comprising conductor tracks and contact pads is arranged on the coplanar area. The contact pads are electrically connected via conductor tracks to contact areas of the semiconductor chip on the coplanar area, so that the plastic housing composition with electrically semiconducting and/or electrically conducting filler particles is in contact neither with the conductor tracks nor with the contact pads nor with the contact areas. This means that semiconductor devices constructed in this way can preferably be equipped with a plastic housing composition according to the invention and thus have an improved thermal conductivity.

Semiconductor devices which include semiconductor chips with flip-chip contacts on the active upper sides of the semiconductor chips include a wiring substrate, on which the semiconductor chips with the flip-chip contacts are arranged. However, the upper side of the wiring substrate with the flip-chip contacts is embedded in an insulating underfill matrix, so that the surrounding plastic housing composition with electrically semiconducting and/or electrically conducting filler particles makes contact neither with the wiring structure of the wiring substrate nor with the flip-chip contacts. With this type of semiconductor device, it is accordingly not necessary to implement any precautionary measure at all to protect the internal wiring from the electrically conducting or semiconducting plastic composition, since this protection is already afforded by the insulating underfill material.

A method for producing a plurality of semiconductor devices with a plastic housing composition including electrically semiconducting and/or electrically conducting filler particles is carried out with the following steps as described below.

The first step involves producing electrically semiconducting and/or electrically conducting filler particles. These filler particles are subsequently mixed with a plastic housing composition. This is followed by packaging of semiconductor chips arranged in rows and columns in semiconductor device positions of a panel into the plastic housing composition with the formation of a coplanar area comprising upper sides of semiconductor chips and upper sides of the plastic housing composition. A patterned insulation layer is subsequently applied selectively to the coplanar area while leaving free contact areas of the semiconductor chips. A wiring structure is then applied selectively to the patterned insulation layer while connecting the contact areas of the semiconductor chip to contact pads of the wiring structure via conductor tracks of the wiring structure. Finally, external contacts are applied to the contact pads and the panel with its semiconductor device positions can subsequently be separated into individual semiconductor devices. It is also possible for the external contacts to be applied to the contact pads only after the separation of the semiconductor device positions into individual semiconductor devices.

If the semiconductor device has flip-chip contacts, then the latter are produced by a method that deviates in some steps from the method described above. The first step, however, involves producing electrically semiconducting and/or electrically conducting filler particles, and the latter are mixed with a plastic housing composition. A further production method relates firstly to a semiconductor wafer with semiconductor chip positions and flip-chip contacts in the semiconductor chip positions and also to separation of the semiconductor wafer into individual semiconductor chips with flip-chip contacts. A wiring substrate with a wiring structure and corresponding semiconductor device positions is prepared in parallel with this. This is followed by applying the semiconductor chips by their flip-chip contacts in the semiconductor device positions of the wiring substrate.

Afterward, the plastic housing composition with its electrically conducting particles is not immediately applied, since the flip-chip contacts and also the wiring structure are still unprotected and uncovered. Therefore, firstly the flip-chip contacts and the active upper side of the semiconductor chips and also the wiring structure on the wiring substrate are embedded in an insulating underfill composition which is adapted to the semiconductor chip in terms of its thermal expansion behavior. After the introduction of the underfill material, the plastic housing composition can then be applied to the upper side of the wiring substrate while embedding the semiconductor chip and the underfill material in the plastic housing composition. Finally, external contacts can be applied to the wiring substrate, to be precise to the underside thereof, and the wiring substrate can subsequently be separated into individual semiconductor devices.

This method makes it possible to produce semiconductor devices including, as plastic housing composition, a plastic housing composition with electrically semiconducting and/or electrically conducting filler particles without the risk of the flip-chip contacts being short-circuited by the electrically semiconducting and/or electrically conducting filler particles.

In one preferred exemplary method, a melt of the filler material is atomized for the purpose of producing electrically semiconducting and/or electrically conducting filler particles. During this atomization, virtually spherical, very small filler particles arise and enable a high degree of filler in the plastic housing composition. Instead of atomization, it is also possible to use dropwise application, which produces spherical filler particles with larger dimensions.

In an alternative method, after the atomization or dropwise application, the electrically semiconducting and/or electrically conducting filler particles are passed through an oxidizing gas stream, so that the surfaces oxidize. However, only filler particle materials which do not themselves form volatile oxides are suitable for this purpose. In a similar manner, silicon particles may be provided with a diamond and/or silicon carbide coating in a fluidized bed furnace, by way of example.

Moreover, the filler particles may be provided with such layers in chemical or physical deposition methods. Furthermore, it is also possible for the filler particle material to be ground or even pulverized using traditional methods.

In order to produce carbon fullerenes, carbon electrodes are preferably pulverized in electrical discharge flashes, a high portion of fullerenes being formed.

To summarize, it can be established that for a good thermal conductivity of the plastic housing composition, the fillers should have a correspondingly good thermal conduction. This good thermal conduction in conjunction with the requirement for good electrical insulation and small thermal expansion is provided only in the case of pure diamond and a few ceramic materials. However, there are device forms, such as the "universal packaging concept", in which electrical insulation of the plastic housing composition can be dispensed with since corresponding insulating layers are provided between the semiconductor chip or the plastic surface and the metallic wiring structures in semiconductor components of this type.

It is also possible to use conductive materials having a correspondingly low coefficient of expansion and a correspondingly high thermal conductivity, as has been shown in the exemplary embodiments above. However, the flow properties of the plastic housing composition greatly depend on the geometrical dimensions of such filler particles. Round bodies with corresponding diameter distributions are advantageous as filler particles, so that volume interstices can be filled by smaller grains. Fiber materials are not always optimally suitable with regard to the injection molding process. On the other hand, there are silicon particles which can be adapted in terms of distribution and form to the requirements of the plastic housing composition and the requirements of the injection molding process. The silicon particles can be atomized in the liquid phase, so that they are present as spherical particles. If the liquid phase is not atomized in an inert atmosphere, but rather in an oxygen atmosphere or in a water atmosphere, then an oxide skin automatically arises, which has an improved adhesion to the plastic housing composition and simultaneously has an electrically insulating action.

Moreover, it is possible to coat such silicon particles with extremely thin diamond layers, a method for the diamond coating of silicon particles being less expensive and more cost-effective than diamond production itself, whereby at the same time the thermal conductivity of the silicon particles is also improved in conjunction with an increase in the contact resistances between the individual silicon particles. As already envisaged above, metals having a high melting point such as tungsten and molybdenum are also appropriate since they have a very low coefficient of expansion with sufficient thermal conduction. An atomization and/or a coating are possibly feasible.

The invention is now described in further detail in relation to exemplary embodiments as depicted in FIGS. 1-4.

FIG. 1 shows a schematic cross section through a semiconductor device 1 of a first embodiment of the invention. The semiconductor device 1 was produced according to the "universal packaging concept". In particular, the semiconductor chip 10 is embedded in a plastic housing composition 3 according to the invention such that the active upper side 9 of the semiconductor chip 10 together with the upper side 8 of the plastic housing composition 3 forms a coplanar area 7. Freely accessible contact areas 15 on the active upper side 9 of the semiconductor chip 10 then lie on the coplanar areas 7. An insulation layer 5 is applied to the upper side 8 of the plastic housing composition and to the upper side 9 of the semiconductor chip, that is to say to the coplanar area 7, while leaving free the contact areas 15 of the semiconductor chip 9.

This layer 5 insulates both the upper side 9 of the semiconductor chip 10 and the surface 8 of the plastic housing composition 3 with its electrically semiconducting and/or electrically conducting filler particles 6. A wiring structure 12, including internal wiring 4 with conductor tracks 13 and contact pads 14, is then applied to an insulating and patterned intermediate layer 11 (formed from the insulation layer 5). In a concluding production step, external contacts 19 are arranged on the contact pads 14.

One advantage of a semiconductor device 1 of this type is the high adaptation of the coefficient of expansion of the plastic housing composition 3 by the filler particles 6, which, as explained above, may comprise fullerenes, carbon nanotubes, silicon, tungsten and/or molybdenum. In this case, the individual filler particles 6 preferably have a geometry that is spherical (e.g., a spherical surface) or generally or approximately cylindrical in form or shape. These surfaces may also be processed with silicon carbide, diamond or other insulating coatings, such as silicon dioxide, to form electrically insulating filler particles 6 prior to introduction into a plastic housing composition 3.

FIG. 2 shows a schematic enlargement of the partial region 22 of FIG. 1. The partial region 22 shows part of the monocrystalline semiconductor chip 10 which is adjoined by an adjacent plastic housing composition 3 with electrically semiconducting and/or electrically conducting filler particles 6. The grain diameter of the filler particles 6 varies in order to achieve a highest possible degree of filler of up to 92% by volume. An insulating intermediate layer 11 is applied on the coplanar area 7 comprising the upper side 9 of the semiconductor chip 10 and the upper side 8 of the plastic housing composition 3, so that neither the semiconductor material nor the possibly electrically semiconducting and/or electrically conducting plastic housing composition 3 can make contact with the wiring structure 12 arranged on the insulating intermediate layer 11.

FIG. 3 shows a schematic cross section through the semiconductor device 1 of FIG. 1 with a heat sink 23 on the plastic housing composition 3. Since the plastic housing composition 3 has a significantly higher thermal conductivity by comparison with conventional plastic housings, the heat loss of the semiconductor chip can be passed on to the heat sink 23 having cooling fins 24 without accumulation of heat in the plastic housing composition 3. Consequently, it is possible to achieve an intensive cooling of the semiconductor device 1 equipped with a plastic housing composition 3 according to the invention. The semiconductor device 1 can be arranged in surface-mounted fashion on a superordinate circuit board 25 and heat loss of the semiconductor chip 10 can be passed on to the surroundings via the circuit board 25, too.

Figure 4:
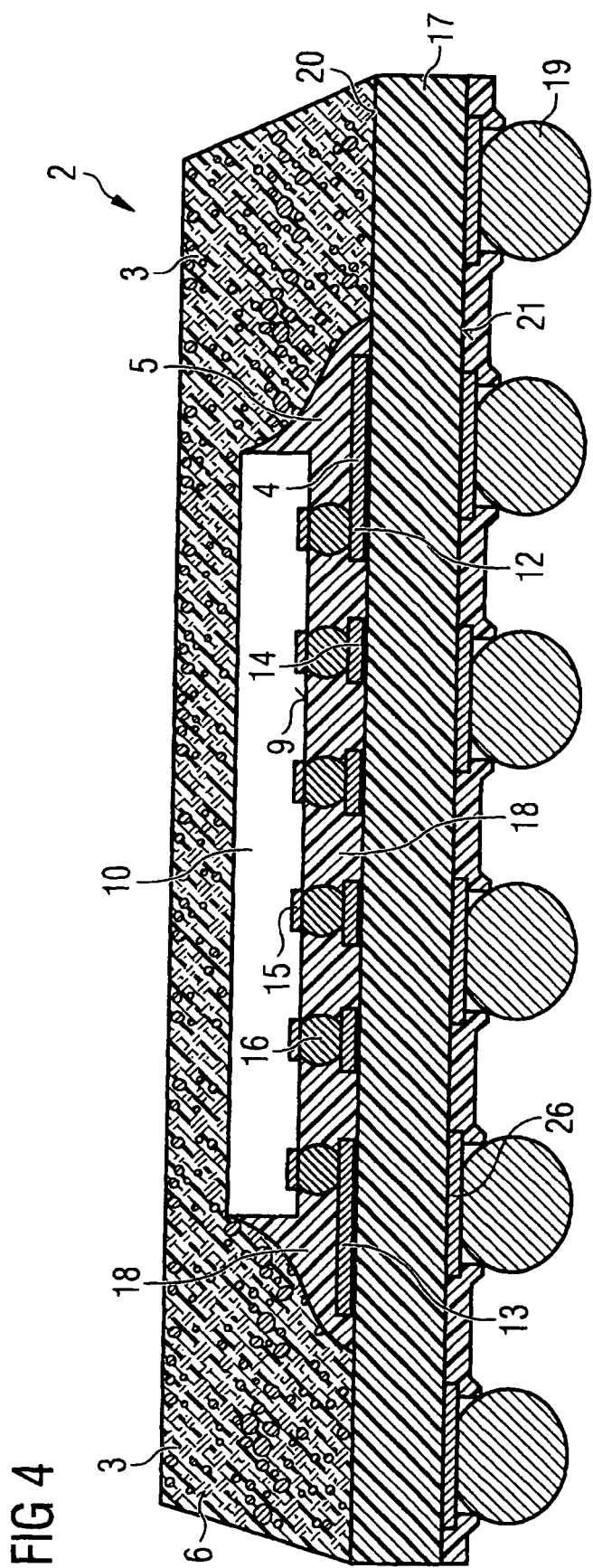
FIG. 4 shows a schematic cross section through a semiconductor device in accordance with a second embodiment of the invention.

FIG. 4 shows a schematic cross section through a semiconductor device 2 of a second embodiment of the invention. Components having functions identical to those in the previous figures are identified by the same reference symbols and are not explained separately. The semiconductor chip 10 does not form a coplanar area with the plastic housing composition 3, rather the semiconductor chip 10 is equipped with flip-chip contacts 16 on its active upper side 9. The flip-chip contacts 16 are electrically connected to the semiconductor chip 10 via contact areas 15. The semiconductor chip 10 is surface-mounted with the flip-chip contacts 15 on a wiring substrate 17, the wiring substrate 17 including a wiring structure 12 with conductor tracks 13 and contact pads 14 as internal wiring 4 on its upper side 20.

The wiring structure 12 and also the flip-chip contacts 16 and the active upper side 9 of the semiconductor chip 10 are embedded in an insulating underfill material 18 for semiconductor devices 2 of this type, so that the plastic housing composition 3 according to the invention with electrically semiconducting and/or electrically conducting filler particles 6 can also be applied. The insulating portion of the upper side 20 of the wiring substrate 17 and also the underfill material 18 and the semiconductor chip 10 are embedded in the plastic housing composition. In order to make contact with the flip-chip contacts externally, external contacts 19 are arranged on corresponding external contact areas 26 on the underside 21 of the wiring substrate 17.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor device comprising:
   at least one semiconductor chip;
   an internal wiring structure including conductor tracks and contact pads, wherein the contact pads are electrically connected via the conductor tracks to contact areas of the semiconductor chip;
   a plastic housing composition that at least partially embeds the at least one semiconductor chip, the plastic housing composition comprising electrically semiconducting and/or electrically conducting filler particles;
   an insulation layer that electrically insulates the internal wiring structure from the plastic housing composition such that the plastic housing composition is not in contact with any of the conductor tracks, contact pads and contact areas that connect the internal wiring structure to the semiconductor chip and wherein the semiconductor chip is in direct contact with the insulation layer that extends over an entire area that defines the semiconductor device.

2. The semiconductor device of claim 1, wherein the plastic housing composition comprises silicon particles.

3. The semiconductor device of claim 1, wherein the plastic housing composition comprises carbon fiber particles.

4. The semiconductor device of claim 1, wherein the plastic housing composition comprises carbon nanotube particles.

5. The semiconductor device of claim 1, wherein the plastic housing composition comprises carbon fullerenes.

6. The semiconductor device of claim 5, wherein the carbon fullerenes comprise spherical carbon fullerene particles.

7. The semiconductor device of claim 1, wherein the plastic housing composition comprises metal particles.

8. The semiconductor device of claim 1, wherein the plastic housing composition comprises at least one of molybdenum particles and tungsten particles.

9. The semiconductor device of claim 1, wherein the plastic housing composition comprises silicon particles with an oxide layer.

10. The semiconductor device of claim 1, wherein the plastic housing composition comprises diamond-coated silicon particles.

11. The semiconductor device of claim 1, further comprising:
    a coplanar area comprising an upper side of the plastic housing composition and an upper side of the at least one semiconductor chip;
    wherein the insulation layer comprises an insulating intermediate layer that carries the internal wiring structure, the conductor tracks and contact pads are arranged on the coplanar area, and the contact pads are electrically connected via the conductor tracks to contact areas of the semiconductor chip at the coplanar area.

12. The semiconductor device of claim 1, wherein an active top side of the semiconductor device is adjacent the insulation layer.

13. The semiconductor device of claim 1, further comprising:
a heat sink arranged directly upon the plastic housing composition, the heat sink comprising cooling fins facing outward and away from the plastic housing composition.

14. The semiconductor device of claim 1, wherein a grain diameter of the conducting filler particles varies.

15. The semiconductor device of claim 1, wherein the conducting filler particles comprise silicon particles coated with a layer comprising at least one of diamond, tungsten and molybdenum.

* * * * *